(12) United States Patent
Schulz-Harder (10) Patent No.: US 7,051,793 B1
(45) Date of Patent: May 30, 2006

(54) COOLER FOR ELECTRICAL COMPONENTS

(76) Inventor: Jurgen Schulz-Harder, Hugo-Dietz-Strasse 32, D-91207 Lauf (DE)

( * ) Notice: Subject to any disclaimer, the term of this patent is extended or adjusted under 35 U.S.C. 154(b) by 0 days.

(21) Appl. No.: 09/294,388

(22) Filed: Apr. 20, 1999

(30) Foreign Application Priority Data

Apr. 20, 1998 (DE) ................ 198 17 383
Apr. 28, 1998 (DE) ................ 198 18 839

(51) Int. Cl.
*H05K 7/20* (2006.01)

(52) U.S. Cl. ............... 165/104.26; 165/104.33; 361/700

(58) Field of Classification Search ......... 165/104.26, 165/104.33, 911; 361/700; 257/715
See application file for complete search history.

(56) References Cited

U.S. PATENT DOCUMENTS

| | | | | |
|---|---|---|---|---|
| 4,747,448 A | * | 5/1988 | Beduz et al. | 165/911 |
| 4,840,224 A | * | 6/1989 | Dietzsch | 165/104.26 |
| 5,427,174 A | * | 6/1995 | Lomolino, Sr. et al. | 165/104.26 |
| 5,835,345 A | * | 11/1998 | Staskus et al. | 361/699 |
| 6,003,591 A | * | 12/1999 | Campbell | 165/104.26 |
| 6,014,312 A | * | 1/2000 | Schulz-Harder et al. | 361/699 |
| 6,056,044 A | * | 5/2000 | Benson et al. | 165/104.26 |

FOREIGN PATENT DOCUMENTS

| | | | |
|---|---|---|---|
| JP | 0133590 | * | 10/1981 |
| SU | 1341487 | * | 9/1987 |

* cited by examiner

*Primary Examiner*—Allen J. Flanigan
(74) *Attorney, Agent, or Firm*—Hoffman, Wasson & Gitler (57) ABSTRACT

The invention relates to a novel design of a cooler in the form of a heat pipe, with a housing in which an interior space closed to the outside is formed to hold a liquid, vaporizable coolant or heat-transport medium.

33 Claims, 14 Drawing Sheets

COOLER FOR ELECTRICAL COMPONENTS

BACKGROUND OF THE INVENTION

The invention relates to a cooler, in particular, a cooler for electrical components, in the form of a heat pipe.

Coolers of this type are fundamentally known and are based on the principle of vaporization and condensation of a coolant, or heat transport medium, housed in the closed interior of the cooler. Generally these coolers have a round structure (U.S. Pat. No. 3,537,514). Lengthwise grooves are used as the capillary structure. These round coolers must be connected to a flat carrier on which the components to be cooled are located. These carriers yield additional heat transfer or thermal resistance.

Furthermore, it is also known to have a flat design for this cooler (U.S. Pat. No. 5,642,775). These known coolers consist of a block in which tubular channels are formed. Production is complex and expensive.

Furthermore, it is also known to have a cuboidal cooler (U.S. Pat. No. 4,957,803); its housing consists of a plurality of metal layers stacked on top of one another and connected superficially to one another, which are structured and arranged such that within the body, slots yield crossing channels which are joined to one another at the crossing points. This known design is only suited as a thermal spreader. There are no differing vapor channel and capillary structures. In addition, heat transport over long distances is necessary.

The object of the invention is to devise a cooler with improved properties.

SUMMARY OF THE INVENTION

The cooler as claimed in the invention is characterized by a simple and economical production. Transmission of heat energy from the outside, into the vaporization area, into the cooler, or from the condensation area to the outside over a short distance is possible by posts which are located in the area of the capillary structure and which are formed by the metal layers. Furthermore, the cooler has a vapor channel area or a vapor channel structure with a large flow cross section, yielding optimum cooling output.

BRIEF DESCRIPTION OF THE DRAWINGS

The invention is detailed below using the following figures:

FIGS. 20, 21 and 22 show representations similar to FIGS. 17, 18 and 19, but for the vapor channel area;

DETAILED DESCRIPTION OF THE INVENTION

In FIGS. 1–22, a heat sink or cooler for dissipating the heat of a heat source is labeled 1. The cooler 1 is built as a heat pipe, but in contrast to the known heat pipe arrangements, the cooler 1 has a very flat plate-shape with flat surfaces on the top and bottom. In the embodiment shown in FIG. 1, the cooler 1 is shown in an overhead view with a rectangular peripheral line, or with the shape of a very flat cuboid, which is rectangular in an overhead view.

Figure 1:
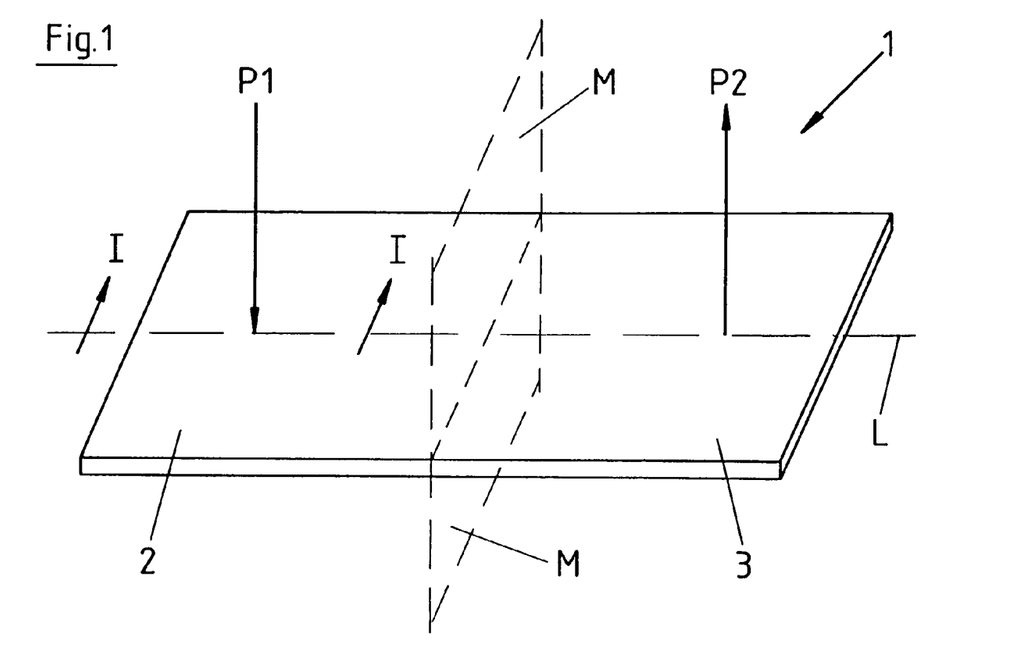
FIG. 1 shows, in a simplified perspective view, a cooler in the form of a flat, plate-shaped or cuboidal heat pipe.

Generally the cooling or vaporizer area (first area) is labeled 2, and the second area for heat dissipation, or the condenser area, is labelled 3. The two areas are offset against one another in the lengthwise direction L, of the plate-shaped cooler 1, and on either side of a center plane M, which inter sects the cooler 1, and its lengthwise sides vertically. The heat dissipated on the area 2, to the cooler 1 is labelled with an arrow P1, and the heat dissipated by the cooler 1, on area 3, is labelled by an arrow P2. The heat source is formed by the semiconductor power components which are provided on the closed flat top and/or bottom of the cooler 1, on area 2, the flat top and/or bottom being formed by one metal layer 7 (metal foil or plate).

Figure 2:
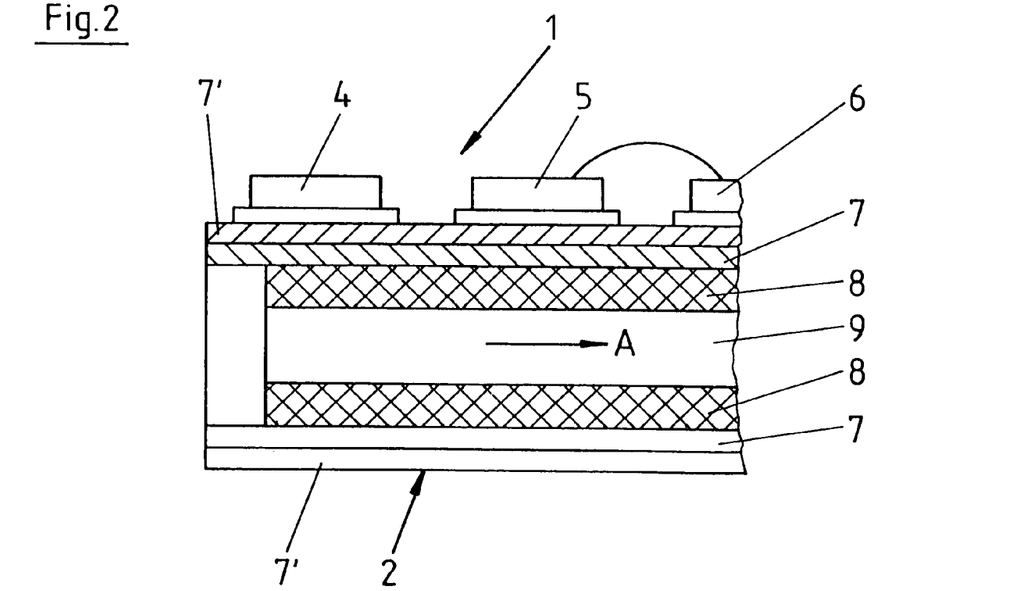
FIG. 2 shows a section along line I—I of FIG. 1.

In FIG. 2, these semiconductor power components, or chips, which produce heat loss, are labelled 4–6. For electrical insulation on the top and/or bottom of the cooler 1, there is provided, at least in the area of chips 4–6, one ceramic layer 7', which is connected in a suitable manner to the closed metal layer 7, which forms the top and bottom of the cooler.

The inner structure of the cooler 1, and how it works, in general, follow from FIG. 2. The inner structure consists of three areas which each extend over the entire cooler, and which are stacked on top of one another, between the top and bottom metal layer 7, more specifically it consists of two outer capillary structures or areas 8, and a middle vapor channel, or vapor channel area, or vapor channel structure 9. The capillary areas 8 are formed by a host of channels which extend between the two areas 2 and 3 and are connected, in at least these areas to the vapor channel or the vapor channel area 9. The vapor channel is a continuous channel which extends over the entire length and width of the cooler 1, or is formed, in the manner detailed below, by a structure of several individual channels, the entire cross section of the vapor channel being much larger compared to the overall cross section of the capillary areas 8.

The interior of the cooler 1 is partially filled with a coolant which vaporizes when heated. In the simplest case water, also in mixture with an additive, for example, methanol, is suited as the coolant.

How the cooler 1 works is based on the fact that the heat which has flowed onto the area 2 vaporizes the coolant there within the cooler and the vapor then flows in the vapor channel 9 from the area 2 in the direction to the area 3, i.e. in the direction of the arrow A of FIG. 2. On the area 3, the heat is dissipated to the outside according to arrow P2. This leads to condensation of the coolant, which as condensate travels into the capillary areas 8, and from there under capillary action flows back opposite the arrow A of FIG. 2 on the area 2, where then again vaporization of the medium takes place by the absorbed heat P1, etc. The cooler 1, with reference to the vaporizable coolant provided in the interior of this cooler, forms a closed system, as is inherently known of heat pipe systems.

FIG. 3 shows again in a simplified representation, the cooler 1, and on the area 3, cooling elements, or cooling sheets 10, being provided on the outside, which with a large surface cause dissipation of the heat to the outside according to arrow P2, and through or around, by an air stream generated by fan flows.

Figure 3:
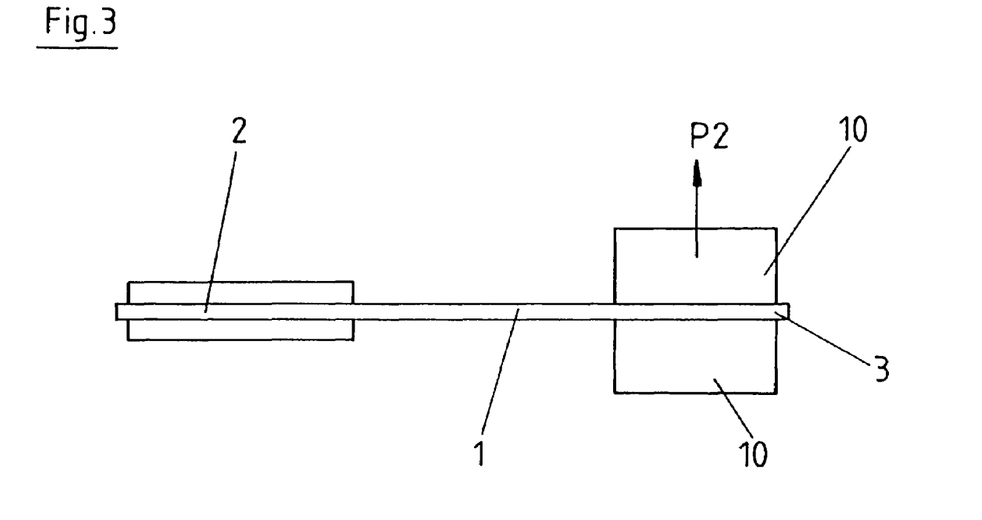
FIGS. 3 and 4 show other possible embodiments of the cooler of the invention.
Figure 4:
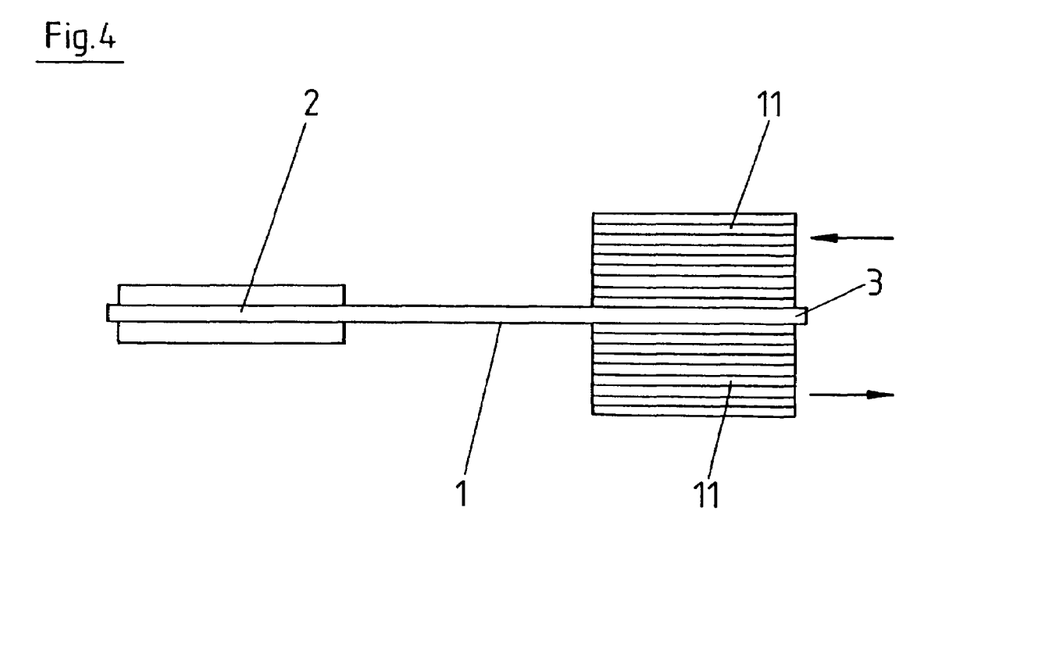

FIG. 4 shows in a similar representation to FIG. 3, an auxiliary cooler 11 which is located on the area 3 and through which a coolant or heat-transporting medium of an external cooling system flows, for example, cooling water of an external cooling circuit. This auxiliary cooler 11 can be formed directly on the area 3 of the cooler 1 by several metal layers which are stacked on top of one another and which are joined superficially to one another and in the housing of the auxiliary cooler 11 form internal, closed cooling channels through which the external coolant flows. In particular, it is possible to form the auxiliary cooler 11 as a so-called microcooler, as is described for example in DE 197 10 783.

Figure 5:
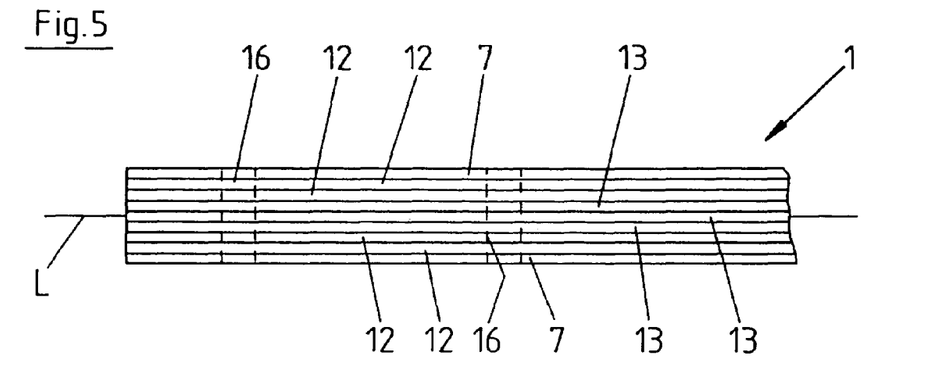
FIG. 5 shows in an enlarged partial representation, and in a side view, the heat pipe, as claimed in the invention, formed by a stack of several metal layers.

As is indicated in FIG. 5 with 12 and 13, the cooler 1 is formed by a plurality of metal layers, for example copper layers or plates, or cutouts from a copper foil, which are structured such that within the cooler 1 between these layers, and/or through these layers, the capillary structures 8 through the metal layers 12, and vapor structures 9 through the metal layers 13, with the corresponding channels which extend at least in the lengthwise direction L result.

FIGS. 6–22 show different embodiments for the cooler 1 which differ essentially only by the different structuring of the metal layers 12 and 13.

Figure 6:
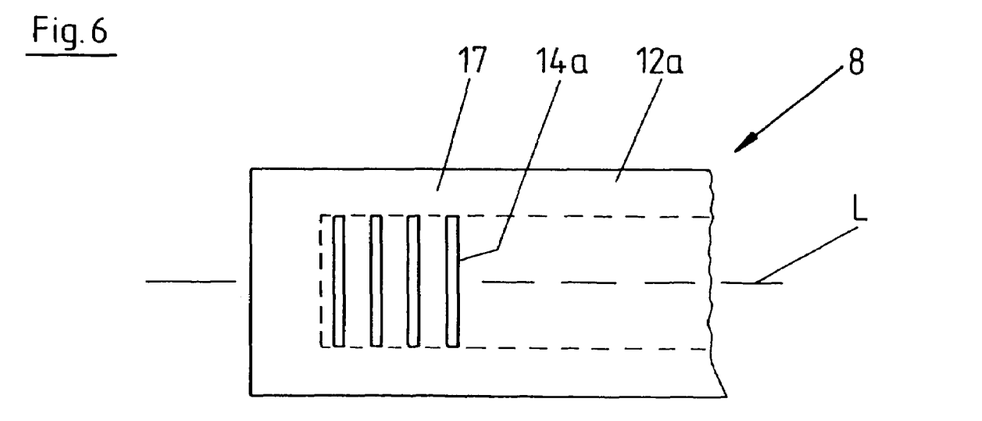
FIGS. 6 and 7 each show in a simplified view, and in an overhead view, two individual or metal layers for example of copper for the capillary area (FIG. 6) and the vapor channel area (FIG. 7)
Figure 7:
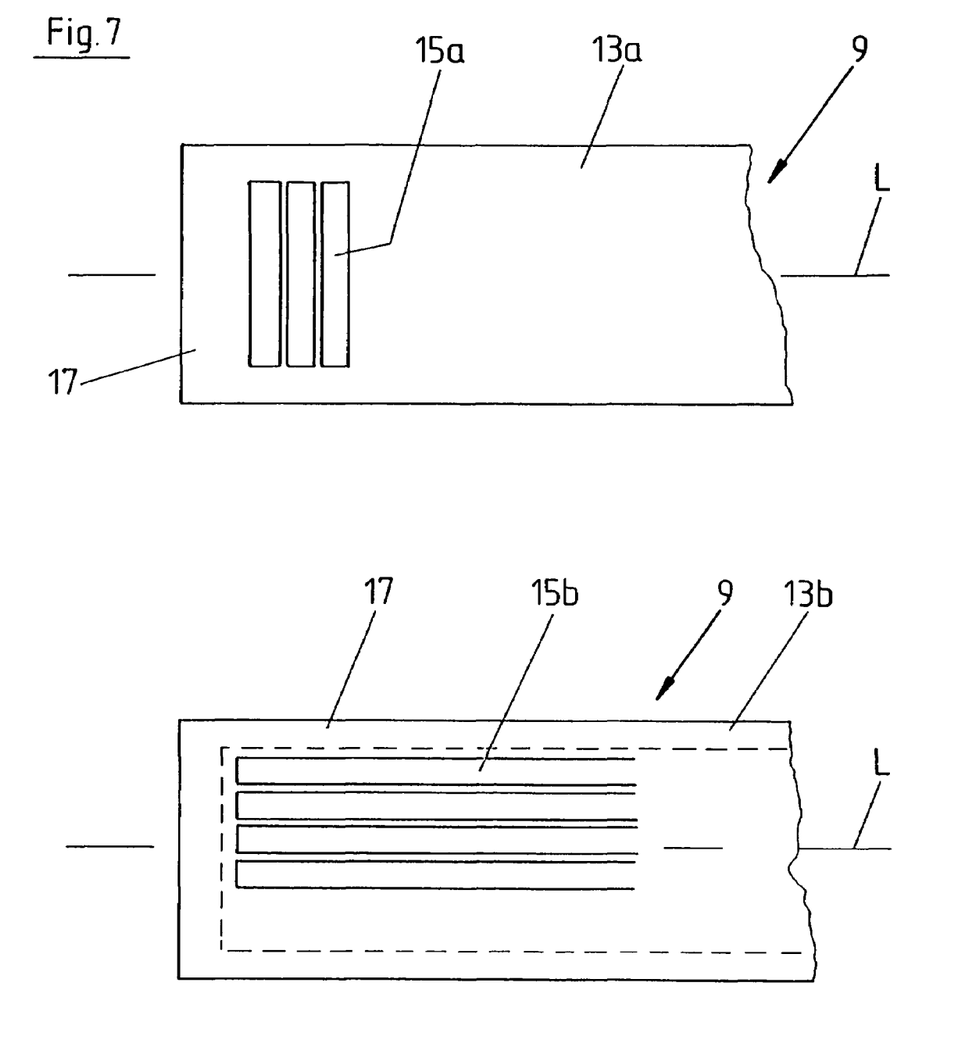
Figure 8:
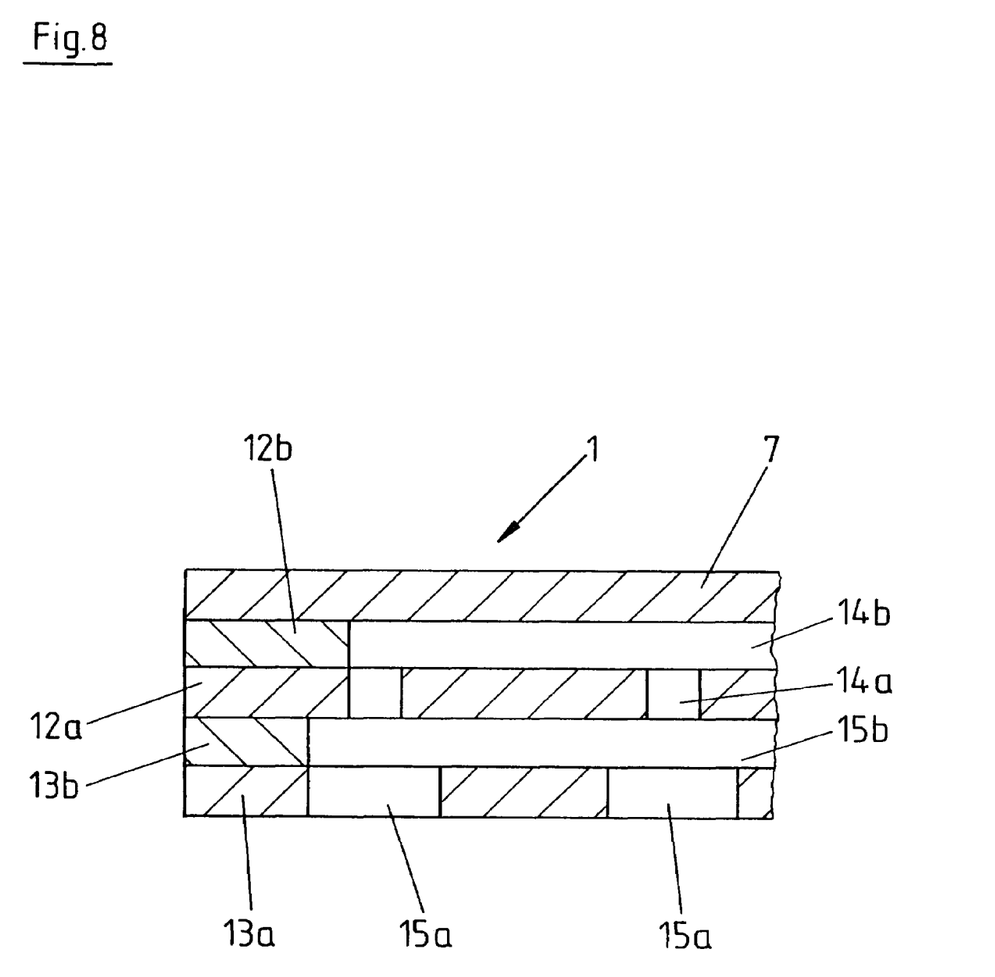
FIG. 8 shows, in a partial schematic, a section through the capillary area, or through the vapor area, of FIGS. 6 and 7.

According to the embodiment of FIGS. 6–8, to form the capillary structures 8 metal layers 12a and 12b are used which are each provided with a plurality of continuous parallel slots, the slots 14a in the metal layers 12a extending transversely to the lengthwise direction L and the slots 14b in the metal layers 12b extending in the lengthwise direction L.

For the vapor area, or the vapor channel structure 9, there are metal layers 13a and 13b, which in turn have slots 15a and 15b, which correspond to slots 14, and slots 15a in the metal layer 13a perpendicular to the lengthwise axis L and slots 15b in the metal layer 13b in the lengthwise direction L. The design is such that the axial distance of two adjacent slots 14a and 14b is the same not only on the metal layers 12a and 12b, but is also equal to the axial distance of two slots 15a and 15b on the metal layers 13a and 13b. In any case, the width of the slots 15a and 15b is roughly 1.5–10 times greater than the width of the slots 14a and 14b. Furthermore, the thickness of the metal layers 13a and 13b, is roughly 1–3 times the thickness of the metal layers 12a and 12b.

The stacking of the metal layers 12a and 12b forms capillary structures 8 with crossing channels, which are connected to one another, at the crossing points, and which are formed by the slots 14a and 14b. Likewise, by stacking the metal layers 13a and 13b on top of one another, a vapor structure 9 is achieved with crossing channels, which are connected to one another at the crossing points, formed by the slots 15a and 15b. This approach results in that after joining the metal layers by the latter within the body of the cooler 1 produced in this way, continuous post-like areas 16 are formed, which extend from the top metal layer 7, which tightly seals the upper capillary area 8, as far as the lower metal layer 7, which tightly seals the lower capillary area 8, and which deliver the necessary strength for the cooler 1, and also ensure optimum heat conduction into and out of the cooler 1. These post-like structures 16 are indicated in FIG. 5 with a broken line.

Figure 9:
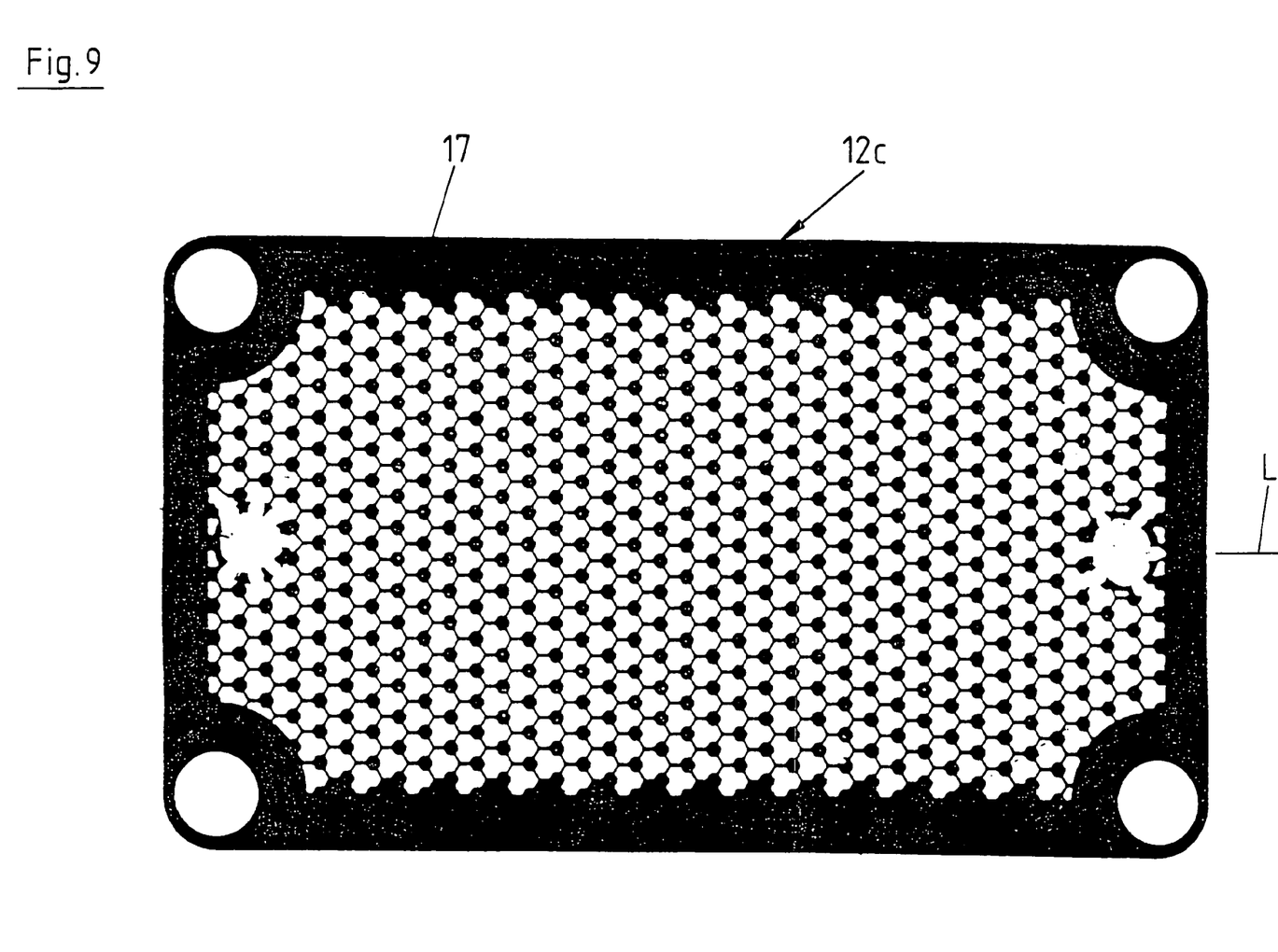
FIGS. 9 and 10 show, in an overhead view, structured metal layers for the capillary area, or the capillary structure, (FIG. 9) or for the vapor channel area or the vapor channel structure (FIG. 10) in another possible embodiment of the invention.

The metal layers 12 and 13, can also be structured differently to form structures 8 and 9. Another example is shown in FIGS. 9–16. FIG. 9 shows a structured metal layer 12c for the capillary structures 8. This metal layer 12c is provided in its middle area, i.e. within a closed edge area 17, in the manner of screen with a plurality of openings 18 which are each made hexagonal and which adjoin one another similarly to a honeycomb structure. These openings 18 are each formed by crosspieces 19, which pass into one another and which surround each opening 18 in the form of a hexagonal ring structure. On the edge area 17 the openings 18 are only partially formed.

On three corners of the hexagonal ring structure of each opening 18, the crosspieces 19 form an island 20 with an enlarged area, i.e. in the embodiment shown with a circular surface. The islands 20 are distributed such that on each opening 18, in an assumed peripheral direction one corner with an island 20, follows one corner without one such island 20. Furthermore, the structuring is chosen such that two crosspieces 19 of each opening 18, lie parallel to the lengthwise axis L, of the rectangular metal layer 12c, and in one axial direction parallel to the lengthwise axis L one island 20, is followed by an opening 18, one corner point without an island, one crosspiece 19 which extends in the direction of the lengthwise axis L, and then a new island 20, etc.

Figure 13:
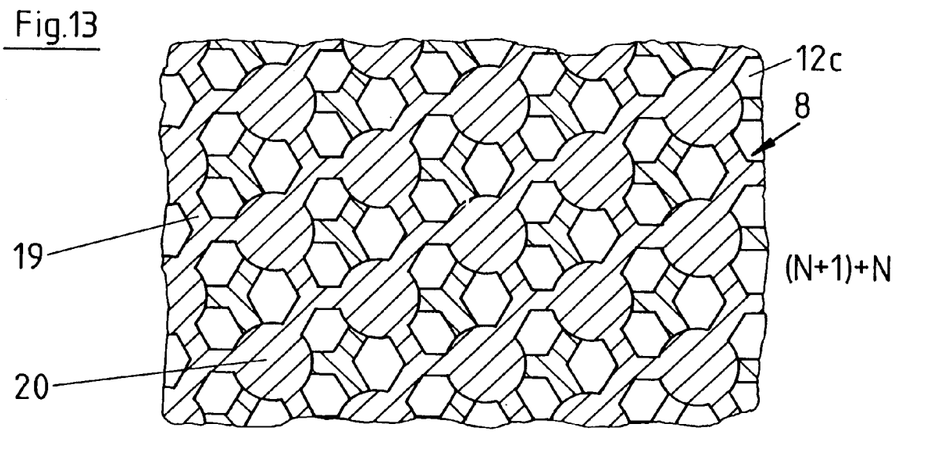
FIG. 13, in a partial representation, shows an overhead view of a partial structure of the capillary area formed by two successive metal layers of FIGS. 11 and 12.
Figure 14:
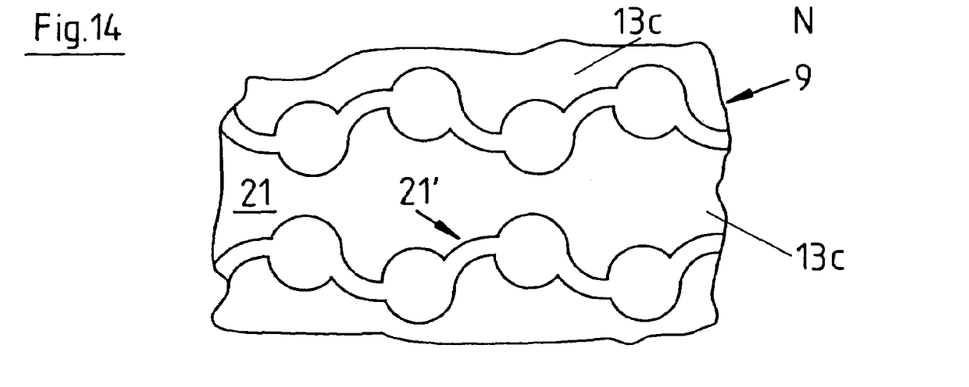
FIGS. 14, 15 and 16 show representations similar to FIGS. 11, 12 and 13 for the vapor channel area.
Figure 15:
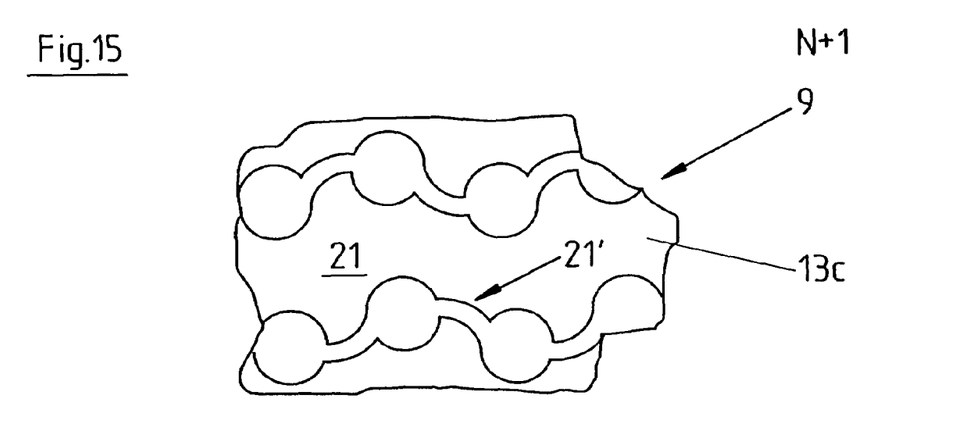
Figure 16:
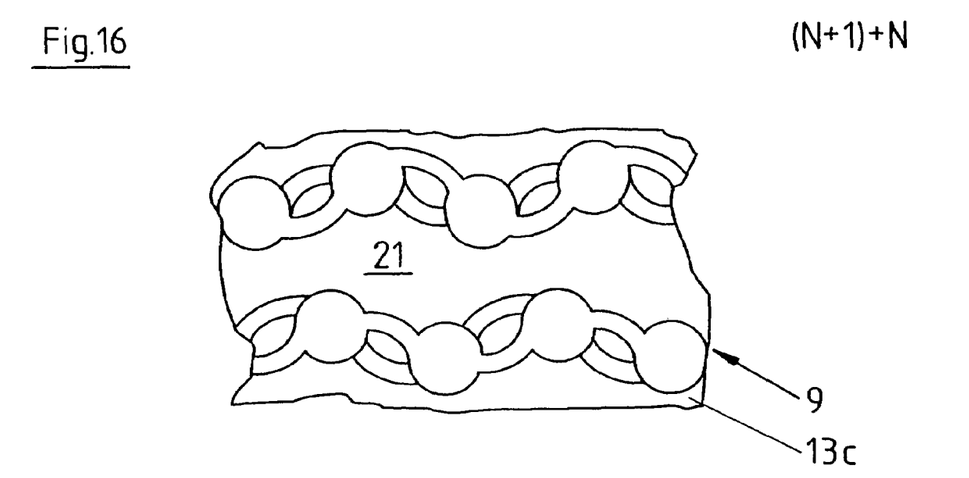

Furthermore, structuring of the metal layer 12c is not completely symmetrical to a center axis which runs perpendicularly to the lengthwise axis L, but the openings 18 are offset relative to the center axis such that it does not intersect the crosspieces 19, which run parallel to the lengthwise axis L, but intersects the islands. In this way, to form the capillary structures 8, it is possible to provide in alternation, one metal layer 12c in the form shown in FIG. 9, as a layer N (FIG. 11), and as the subsequent layer N+1, one metal layer 12c in a layer turned around the center axis (FIG. 12), following one another in order to obtain the structure shown in FIG. 13. in which the islands 20 of these layers N and (N+1) lie on one another, while in the middle of each opening 18, of one layer, there is an area of the adjacent layer on which three crosspieces 19 meet one another without an island 20, as is shown in FIG. 13. With the described structuring of the metal layers 12c therefore using the same metal layers, very finely structured capillary areas 8 with channels widely branched in all three solid axes can be produced simply by turning every other layer.

Figure 10:
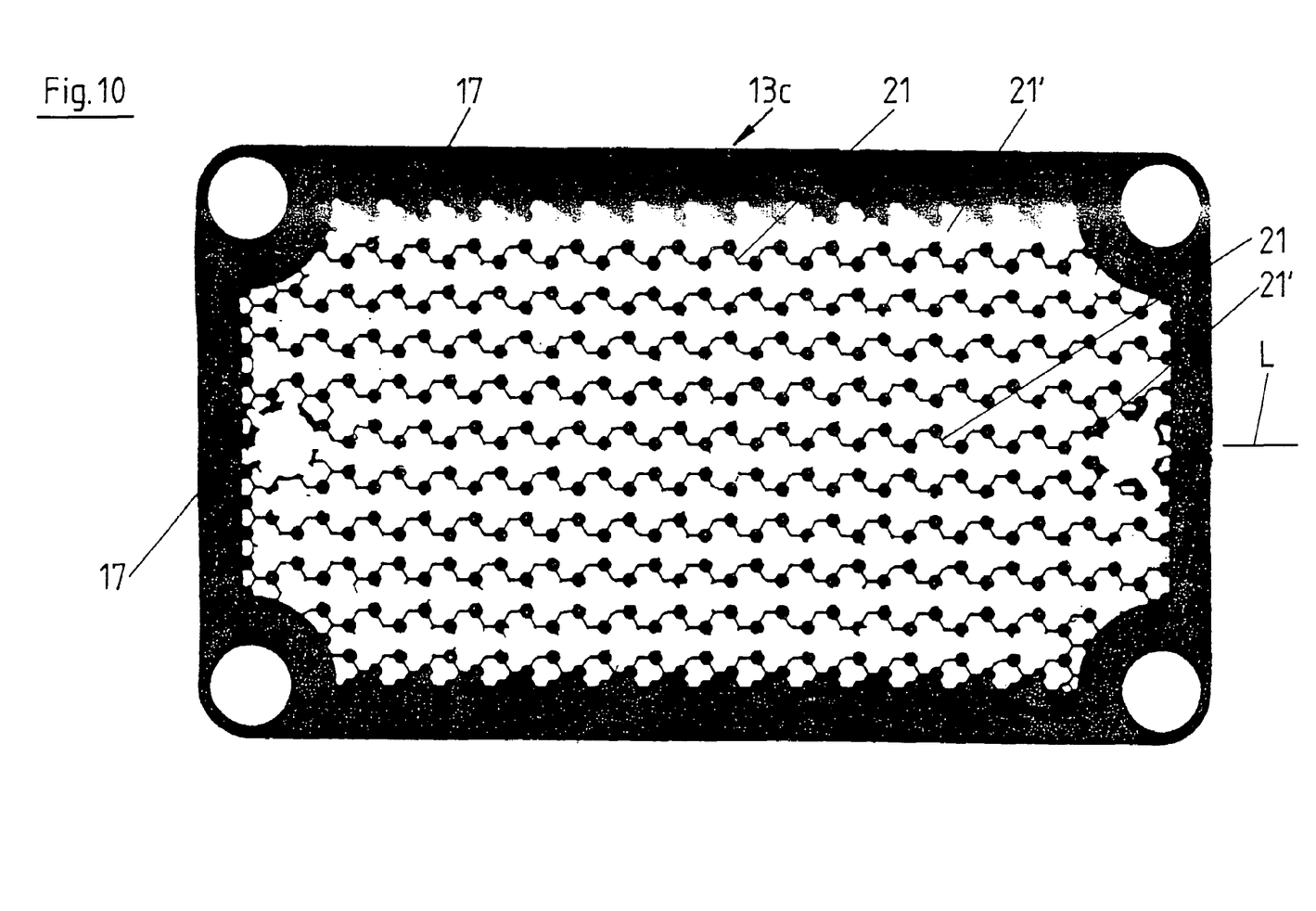
Figure 11:
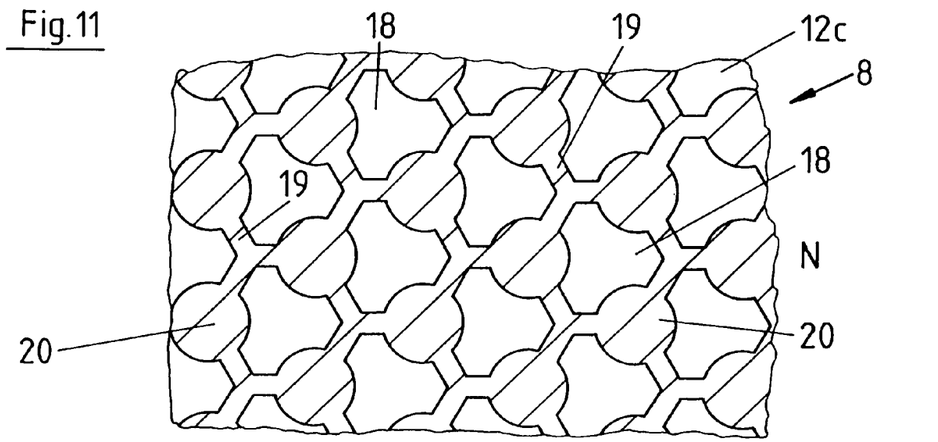
FIGS. 11 and 12 each show, in a partial representation, the two stacked metal layers of FIG. 9 for the capillary area.
Figure 12:
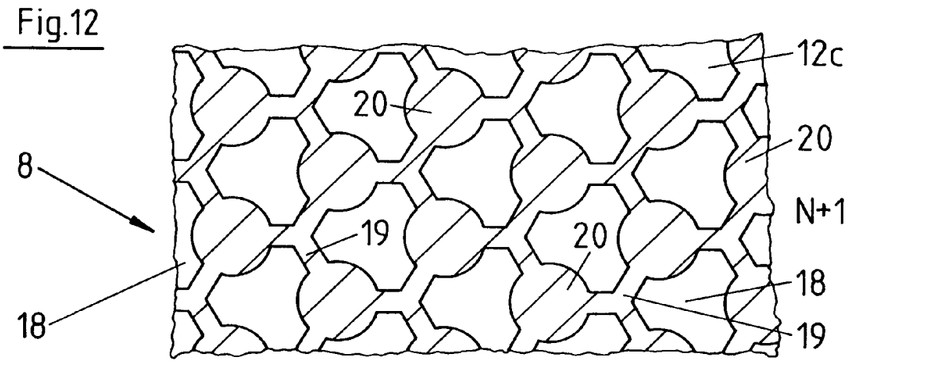

FIG. 10 shows a representation like FIG. 9, with a metal layer 13c for producing the vapor channel structure 9. The metal layer 13c in its structuring corresponds to the metal layer 12c, and differs from it simply in that some of the crosspieces 19, which run transversely to the lengthwise axis L, were omitted, such that the remaining crosspieces 19, together with the islands 20, form zig-zag band-like structures 21', which extend in the lengthwise direction L, with passages 21, which lie in between and which extend in the lengthwise direction. According to FIG. 16, the vapor channel area 9 is formed by at least two metal layers 13c being stacked on top of one another, and connected to one another, such that every other metal layer 13c is turned around the center axis so that also in the vapor area 9, the islands 20 of the individual layers 13c, come to rest on one another and in this way form continuous, post-like structures 16. The passages 21 yield flow channels with larger effective flow cross section for the vapor area 9.

Figure 17:
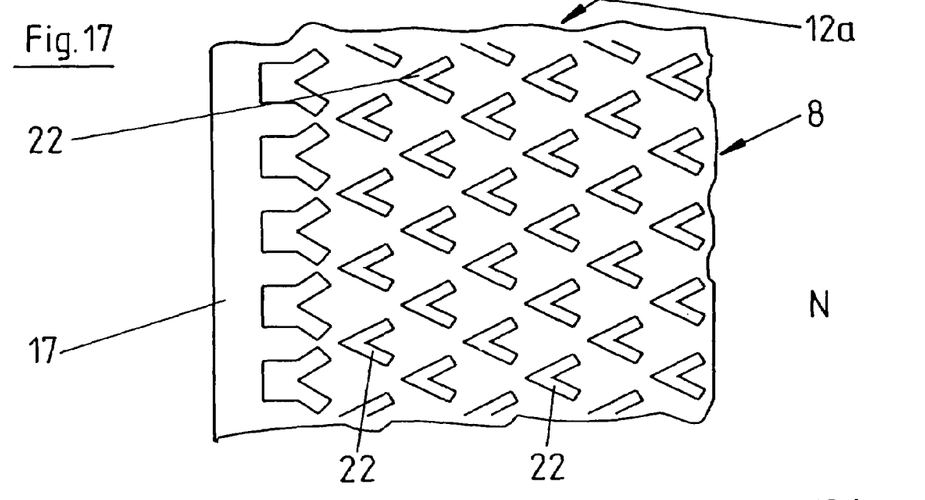
FIGS. 17 and 18 show, in an enlarged partial representation, and in an overhead view, similar to FIGS. 11 and 12, individual metal layers for the capillary area of another possible embodiment.
Figure 18:
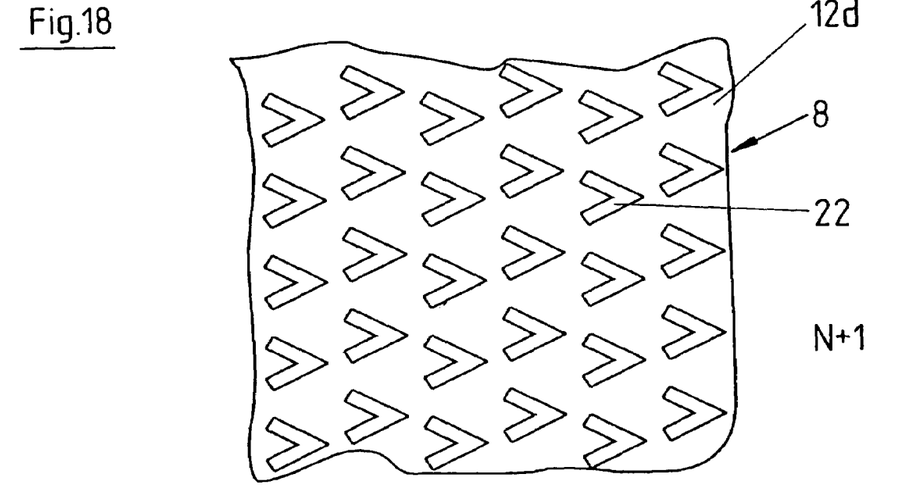
Figure 19:
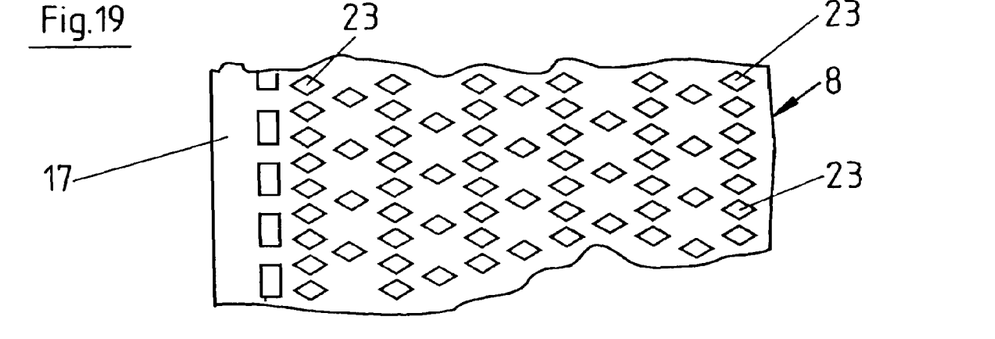
FIG. 19 shows, in a partial representation, an overhead view of a partial structure of the capillary area formed by two successive metal layers of FIGS. 17 and 18.
Figure 20:
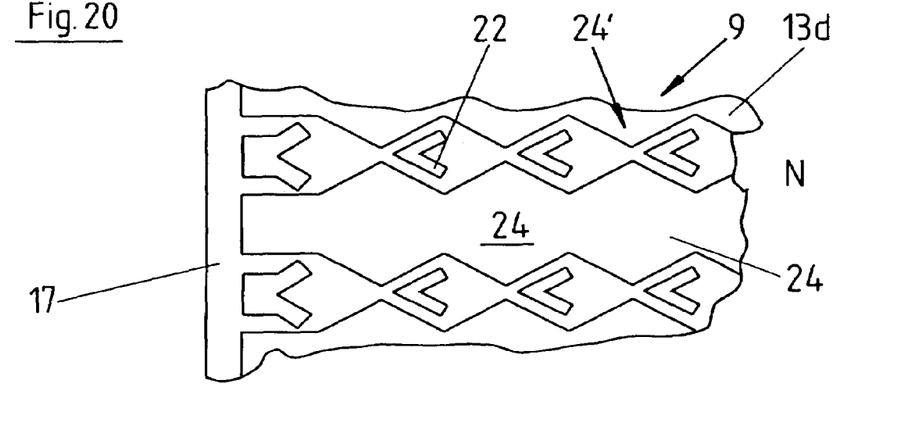
Figure 21:
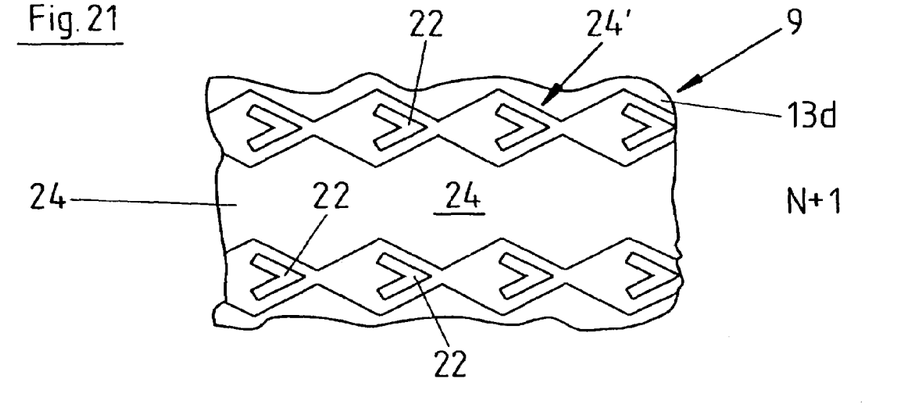

FIGS. 17–22 show as further embodiments, metal layers 12d for forming the capillary structures 8, and the metal layers 13d, for forming the vapor channel structure 9. FIGS. 17 and 18 in turn show the same metal layer 12d, but FIG. 18 in a layer turned around the center axis relative to FIG. 17. Likewise, FIGS. 20 and 21 show the same metal layer 13d, but in FIG. 21 in a layer turned around the center axis relative to FIG. 20.

The metal layer 12d is structured in the manner of the screen within the closed edge area 17, with a plurality of angled openings 22 which are oriented with the angle bisector of their angle segments parallel to the lengthwise axis L.

To form the respective capillary structure 8, at least one metal layer 12 in an unturned form and one metal layer 12 in a turned form, are placed on top of one another, and are connected to one another, such that then the partially overlapping openings yield passages 23, via which the channels formed by the openings 22, in the individual layer, are joined to one another, into a widely branched channel structure, and in addition, post-like areas 16 result.

As FIGS. 17 and 18 show, the openings 22 are each located in several rows which follow one another in the direction of this lengthwise axis and which run perpendicular to the lengthwise axis L, the openings 22 each being offset from row to row on gaps.

Figure 22:
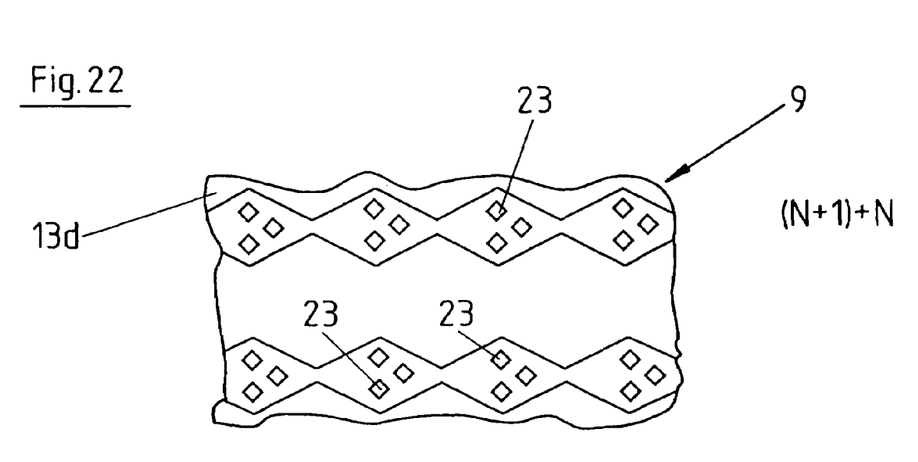
FIG. 22 shows the two layers of FIGS. 20 and 21 on top of one another for forming the vapor channel area.

The metal layer 13d, shown in FIGS. 20 and 22, differs from the metal layers 12d, simply in that, in addition to the openings 22, there are continuous openings which are bordered on the end by the edge area 17, and which extend in the lengthwise direction L, such that in turn band-like structures 24' result, which extend in the lengthwise direction and which also have openings 22. By placing one unturned metal layer 13d, and one turned metal layer 13d, on top of one another on the band-like structures, additional channels are formed which are connected to one another via the passages 23, and also the post like areas 16, which adjoin the areas 16 in the capillary areas 8 and are added to the continuous posts 16 between the metal layers 7.

Figure 23:
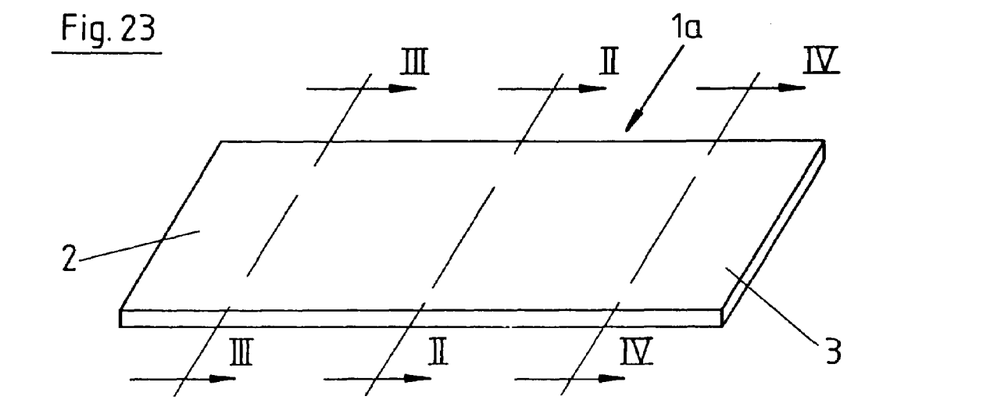
FIG. 23 shows, in the representation of FIG. 1, another possible embodiment of the invention.
Figure 24:
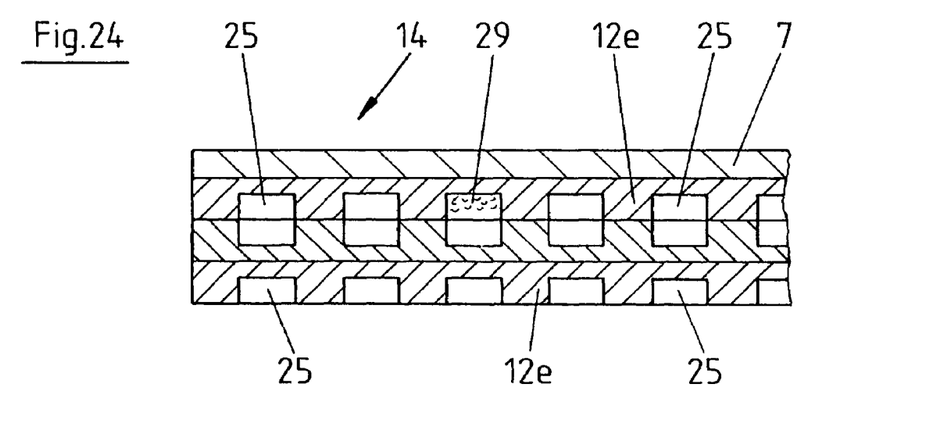
FIG. 24 shows a section along line II—II of FIG. 23, for the sake of simplicity only, the capillary area, or the capillary structure being shown.
Figure 25:
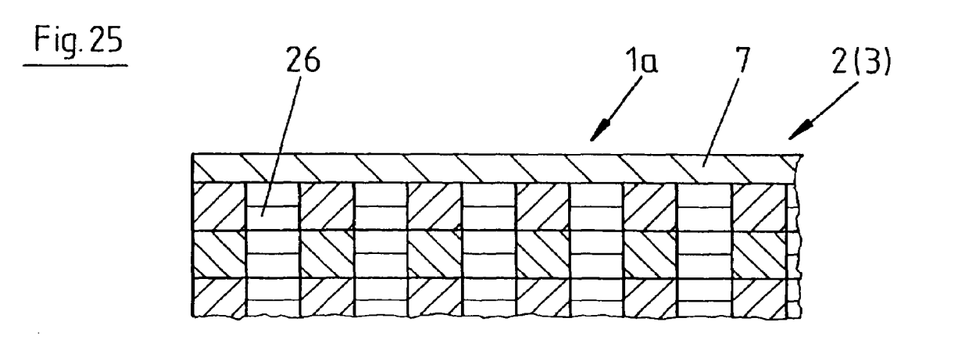
FIG. 25 shows a section along line III—III or IV—IV of FIG. 23, for the sake of simplicity only the capillary area or the capillary structure being shown.
Figure 26:
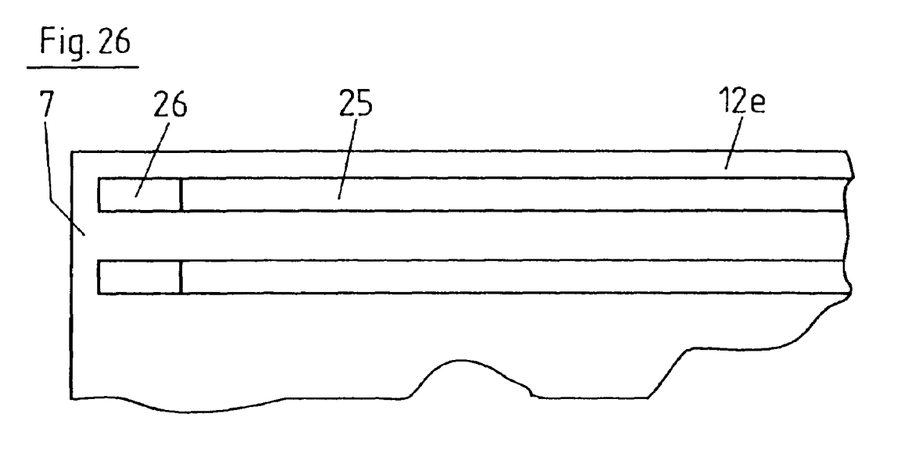
FIG. 26 shows, in a simplified representation, and in an overhead view, one metal layer for the capillary area.

FIG. 23 is another representation according to FIG. 1. FIG. 23 shows a cooler 1a in the form of a heat pipe. In this embodiment, the cooler 1a, or its body, is in turn formed from several copper or metal layers which are joined to one another lying stacked one top of one another to the cooler 1a. The metal layers 12e for the capillary areas 8 are made such that they are each provided on one surface side with several groove-like depressions 25 which extend in the lengthwise direction and which are produced by etching, stamping, or by machining which removes material or shavings, or in some other way. The depressions 25 each end in a continuous opening 26, which is provided at a distance from a closed edge area. The metal layers 12e are then turned alternatingly to form the capillary areas 8, and are placed unturned on top of one another such that each depression 25 of one layer 12e is added to one depression 25 of the adjacent layer 12e to form a channel, as is shown in FIG. 24. On the two ends, or areas 2 and 3, these channels then empty according to FIG. 25, into spaces which are formed by openings 26 in the metal layers 12e and via which the channels are connected to the vapor channel 9.

Figure 27:
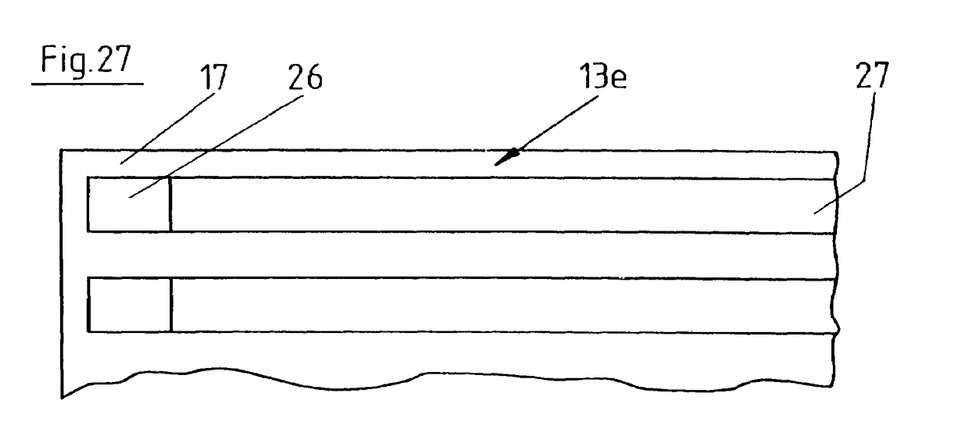
FIGS. 27 and 28 each show, in a simplified representation, and in an overhead view, two additional embodiments of one metal layer for the vapor channel area.
Figure 28:
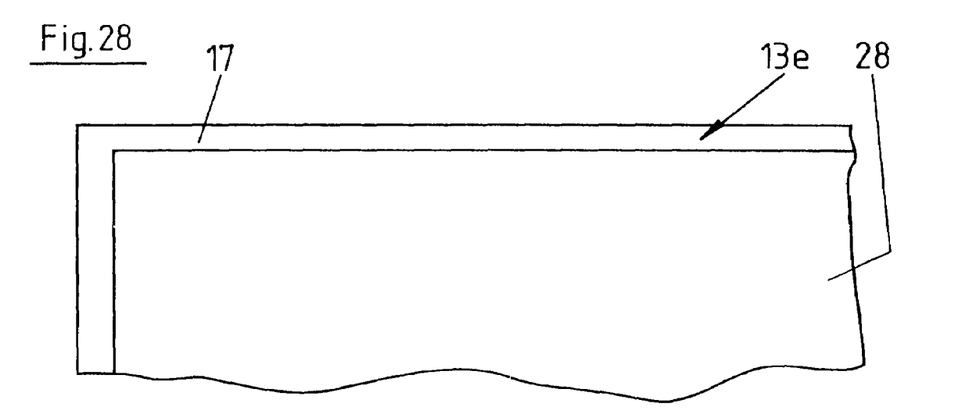

The metal layers 13e, which form the vapor area, or the vapor structure, are made, for example, according to FIG. 27, similarly to layers 12e, simply with depressions 27 of greater width and/or depth, or by the fact that according to FIG. 28, in the metal layers 13e there is one opening 28 with a large area each.

Figure 29:
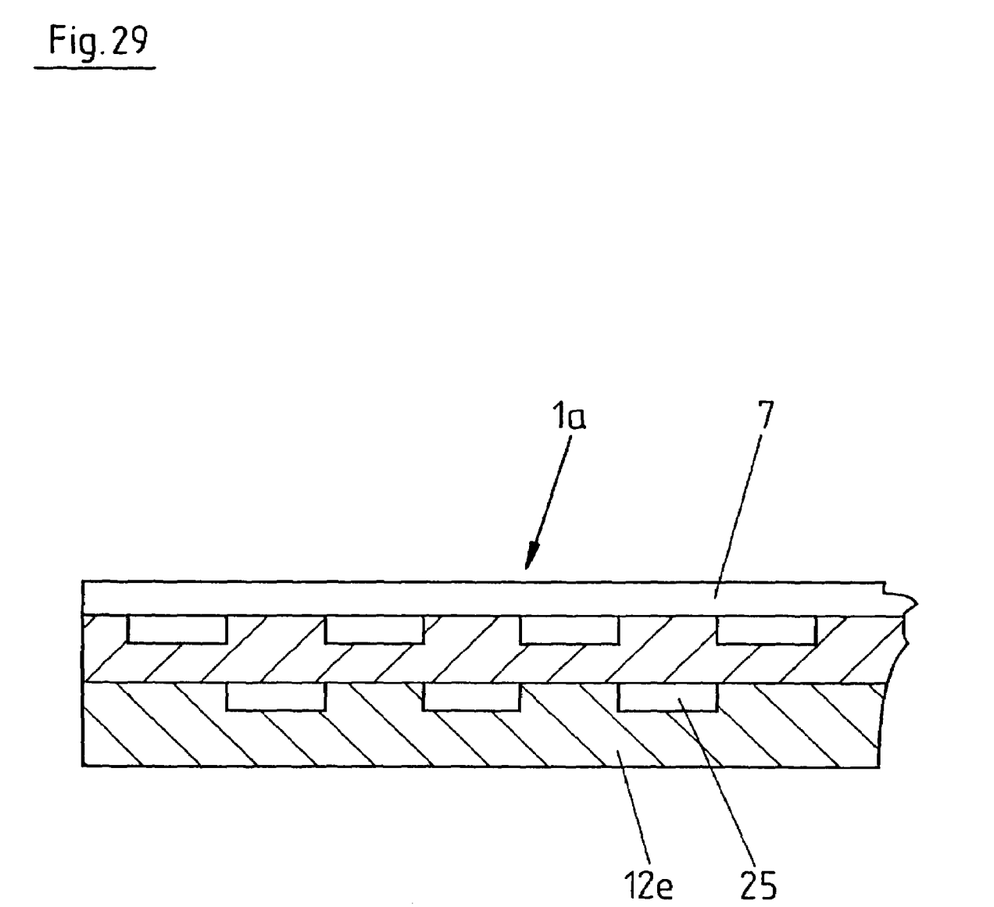
FIG. 29 shows, a representation similar to FIG. 24, another possible embodiment.

FIG. 29 shows a representation similar to FIG. 24. The cooler 1a is disclosed in which the metal layers 12e for forming the capillary structure, are not turned alternatingly, but are each in the same orientation so that the depressions 25 form especially fine channels.

In the above described embodiments it was assumed that the channels which form the capillary structures are free channels. It is also possible to place an auxiliary material which supports and/or causes a capillary effect in these or other structured or shaped channels, also in channels with large effective cross sections, for example, in the form of a powder, for example in the form of a powder consisting of at least one metal and/or metal oxide, for example copper and/or aluminum and/or copper oxide and/or aluminum oxide, and/or in the form of a powder consisting of at least one ceramic, and/or in the form of a powder from mixtures of the aforementioned substances, as is indicated by 29 in FIG. 24.

Copper is suited for the metal layers, the metal layers being joined superficially to one another using DCB technology or active soldering. Aluminum or an aluminum alloy is also suited for the metal layers. In this case, the metal layers are connected to one another by vacuum soldering. The thickness of the metal layers can roughly be between 100 and 1000 microns and the structure widths in the area are between 50 and 1000 microns.

REFERENCE NUMBER LIST 1, 1a cooler
2, 3 area
4–6 component
7 metal layer
7' ceramic layer
8 capillary area
9 vapor channel area
10 cooling element 11 auxiliary cooler
12, 12a, 12b metal layer
12c, 12d, 12e metal layer
13, 13a, 13b metal layer
13c, 13d, 13e metal layer
14a, 14b slot
15a, 15b slot
16 posts
17 edge area
18 opening
19 crosspiece
20 island
21 opening
21' structure
22 opening
23 passage
24 opening
24' structure
25 depression
26 opening
27 depression
28 opening
29 auxiliary material

What is claimed is:

1. A cooler having a housing in which a closed interior space is formed completely sealed from the environment and from any fluid access to hold a liquid, vaporizable coolant or heat-transport medium, with at least one first cooling or vaporization area formed in the housing interior for accommodating a heat output and a second condensation area formed in the housing and is spatially distant for dissipating heat, the housing comprising: a plurality of plates which are superficially joined to one another and which are provided with a plurality of openings for forming channels which are interconnected and which join the first area and the second area; and at least two metal, layers which follow one another in a stack and are structured to form at least one capillary area which extends between the first cooling or vaporization area and the second condensation area, and that at least one other metal layer is structured to form a vapor channel structure with at least one vapor channel, such that the at least one vapor channel extends between the first area and second area and has a flow cross section which is larger than a flow cross section of the at least one capillary area.

2. The cooler as claimed in claim 1, wherein there is at least one capillary area on either side of the vapor channel structure.

3. The cooler as claimed in claim 1, further comprising flat top and bottom surfaces.

4. The cooler as claimed in claim 1, wherein the first area has on at least one surface side of the cooler, at least one electrical component or at least one surface for attaching the at least one electrical component.

5. The cooler as claimed in claim 1, further comprising an auxiliary cooling means on at least the second area.

6. The cooler as claimed in claim 5, wherein the auxiliary cooling means is a cooling element which dissipates heat to ambient air or an ambient medium.

7. The cooler as claimed in claim 5, wherein the auxiliary cooling means is one through which an external coolant flows.

8. The cooler as claimed in claim 1, wherein the plurality of plates are structured such that in an area of these plates a widely branched channel system results, the channel system having continuous, post-like areas between a closed top and bottom.

9. The cooler as claimed in claim 1, wherein the plurality of plates are metal layers which form the capillary structure and metal layers which form the vapor channel structure, are each provided with a plurality of openings and wherein the ratio of a closed area to an open area formed by the openings for the metal layers which form the vapor structure is greater than for the metal layers which form the capillary structure.

10. The cooler as claimed in claim 9, wherein the metal layers which form the capillary structure and the metal layers which form the vapor channel structure are structured similarly, the plurality of openings in the metal layers which form the vapor channel structure having a larger cross section than corresponding plurality of openings in the metal layers which form the capillary structure.

11. The cooler as claimed in claim 9, wherein the metal layers which form the vapor channel structure have more openings than the metal layers which form the capillary structure.

12. The cooler as claimed in claim 1, wherein the plurality of openings in one of the at least two metal layers and the plurality of openings in an adjacent metal layer in the capillary structure in the vapor channel structure in planes of these layers perpendicular hereto form continually changing flow paths between the first and the second area.

13. The cooler as claimed in claim 1, wherein the plurality of openings of at least one metal layer is surrounded by material crosspieces which are joined to one another or which branch in the manner of a network and which form a ring structure around each opening.

14. The cooler as claimed in claim 13, wherein the material crosspieces form a hexagonal ring structure around each opening.

15. The cooler as claimed in claim 13, wherein the ring structure has at least three corner points which form a triangle.

16. The cooler as claimed in claim 1, wherein the first and second areas form continuous post-like or column-like areas.

17. The cooler as claimed in claim 15, wherein the continuous post-like or column-like areas are formed by the corner points of the ring structure.

18. The cooler as claimed in claim 1, wherein the at least two metal layers are made identical in at least one capillary structure, but adjacent layers are turned one to another.

19. The cooler as claimed in claim 1, wherein a structured area of the at least one metal layer has angular openings or breaches.

20. The cooler as claimed in claim 1, wherein the other metal layers for at least one vapor channel structure has additional openings or breaches.

21. The cooler as claimed in claim 1, wherein the at least one metal layer which forms the capillary structure in a structured area is provided with a plurality of slotted openings.

22. The cooler as claimed in claim 21, wherein to form the capillary structure, metal layers of a first type in which the slots extend in a first axial direction, and metal layers of a second type are used in which the slots extend in a second axial direction which includes an angle with the first axial direction.

23. The cooler as claimed in claim 22, wherein the angle is 90°.

24. The cooler as claimed in claim 1, wherein the at least the metal layers for the capillary structure on at least one surface side are provided with a plurality of groove-like depressions.

25. The cooler as claimed in claim 1, wherein the at least one capillary structure is formed by at least one channel in which there is a material which supports and/or produces a capillary action.

26. The cooler as claimed in claim 25, wherein the material which supports and/or produces as capillary action is a powder selected from metal oxide, aluminum, copper oxide, aluminum oxide, ceramic or combinations thereof.

27. The cooler as claimed in claim 1, wherein the at least two metal layers are partially made from metal.

28. The cooler as claimed in claim 1, wherein the thickness of the at least two metal layers is approximately 100–1000 microns.

29. The cooler as claimed in claim 1, wherein structure widths are in the range between 50–1000 microns.

30. A cooler having a housing in which a closed interior space is formed to hold a liquid, vaporizable coolant or heat-transport medium, with at least one first cooling or vaporization area formed in the housing interior for accommodating a heat output and a second condensation area formed in the housing and is spatially distant for dissipating heat, the housing comprising: a plurality of plates which are superficially joined to one another and which are provided with a plurality of openings for forming channels which are interconnected and which join the first area and the second area; and at least two metal, layers which follow one another in a stack and are structured to form at least one capillary area which extends between the first cooling or vaporization area and the second condensation area, and that at least one other metal layer is structured to form a vapor channel structure with at least one vapor channel, such that the at least one vapor channel extends between the first area and second area and has a flow cross section which is larger than a flow cross section of the at least one capillary area, wherein the cooler is formed as a rectangular plate, and the first area and the second area are separated on either side of the cooler by an imaginary center plane (M) which runs perpendicular to a lengthwise extension (L) of the cooler.

31. The cooler as claimed in claim 1, wherein the at least one capillary structure is formed by at least two metal layers and the at least one vapor channel structure is formed by at least one metal layer.

32. A cooler having a housing in which an interior space completely sealed from the environment and from any fluid access is formed to hold a liquid, vaporizable coolant or heat-transport medium, with at least one first cooling or vaporization area formed in the housing interior for accommodating a heat output and a second condensation area formed in the housing and is spatially distant for dissipating heat, the housing comprising:

a plurality of plates which are joined to one another and which are provided with a plurality of openings, at least two metal layers which follow one another in a stack are structured to form at least one capillary area which extends between the first cooling or vaporization area and the second condensation area, at least one other metal layer is structured to form a vapor channel structure with at least one vapor channel, such that the at least one vapor channel extends between the first area and second area and has a flow cross section which is larger than a flow cross section of the at least one capillary area, wherein the structuring of the plurality of metal plates is such that in the area of these plates a widely branched channel system results, the channel system having continuous, post-like areas extending between a closed to and a closed bottom of the cooler; and wherein the plurality of openings in the metal layers forming the vapor channel structure have a larger cross section than plurality of openings in the metal layers which form the capillary structure.

33. A cooler having a housing in which a closed interior space is formed to hold a liquid, vaporizable coolant or heat-transport medium, with at least one first cooling or vaporization area formed in the housing interior for accommodating a heat output and a second condensation area which is formed in the housing and is spatially distant for dissipating heat, the housing comprising:

a plurality of plates which are joined to one another and which are provided with a plurality of openings, at least two metal layers which follow one another in a stack and are structured to form at least one capillary area which extends between the first cooling or vaporization area and the second condensation area, and at least one other metal layer is structured to form a vapor channel structure with at least one vapor channel, such that the at least one vapor channel extends between the first area and second area and has a flow cross section which is larger than a flow cross section of the at least one capillary area, wherein the structuring of the plurality of metal plates is such that in the area of these plates a widely branched channel system results, the channel system having continuous, post-like areas extending between a closed top and a closed bottom of the cooler, and wherein the metal layers which form the vapor channel structure have more openings than the metal layers which form the capillary structure.

* * * * *